(12) United States Patent
Sampei

(10) Patent No.: US 7,078,146 B2
(45) Date of Patent: Jul. 18, 2006

(54) PLANOGRAPHIC PRINTING PLATE MATERIAL, PRINTING PLATE AND PRINTING METHOD

(75) Inventor: Takeshi Sampei, Mitaka (JP)

(73) Assignee: Konica Minolta Medical & Graphic, Inc. (JP)

( * ) Notice: Subject to any disclaimer, the term of this patent is extended or adjusted under 35 U.S.C. 154(b) by 18 days.

(21) Appl. No.: 10/852,917

(22) Filed: May 25, 2004

(65) Prior Publication Data
US 2004/0241600 A1 Dec. 2, 2004

(30) Foreign Application Priority Data
May 30, 2003 (JP) .............. 2003-154212

(51) Int. Cl.
G03F 7/07 (2006.01)
G03C 8/52 (2006.01)
G03C 8/28 (2006.01)
G03C 8/06 (2006.01)
G03C 1/85 (2006.01)

(52) U.S. Cl. .............. 430/204; 430/229; 430/527
(58) Field of Classification Search ................ 430/204, 430/229, 527
See application file for complete search history.

(56) References Cited

U.S. PATENT DOCUMENTS

| 3,295,979 | A | | 1/1967 | Secrist et al. |
| 5,281,509 | A | | 1/1994 | Murakata et al. |
| 5,800,961 | A | * | 9/1998 | Deprez ................ 430/204 |
| 2002/0182533 | A1 | * | 12/2002 | Denzinger et al. ........ 430/264 |
| 2003/0096188 | A1 | * | 5/2003 | Sampei ................ 430/204 |

FOREIGN PATENT DOCUMENTS

| EP | 0742491 A1 | 11/1996 |
| JP | 5-66564 | 3/1993 |

* cited by examiner

*Primary Examiner*—Richard L. Schilling
(74) *Attorney, Agent, or Firm*—Cantor Colburn LLP

(57) ABSTRACT

Disclosed are a planographic printing plate material comprising a plastic sheet support, and provided thereon, a hydrophilic layer, a silver halide emulsion layer, a physical developing nucleus-containing layer, and a backing layer, wherein the hydrophilic layer, the silver halide emulsion layer, and the physical developing nucleus-containing layer are provided on one side of the support, and the backing layer is provided on the other side of the sheet opposite the silver halide emulsion layer, and wherein a surface on the backing layer side has a specific resistance of from $1 \times 10^{11}$ to $1 \times 10^{13}$ $\Omega$, and a coefficient of dynamic friction of from 0.15 to 0.6, the coefficient of dynamic friction being one of the surface on the backing layer side to a stainless steel surface.

9 Claims, No Drawings

PLANOGRAPHIC PRINTING PLATE MATERIAL, PRINTING PLATE AND PRINTING METHOD

FIELD OF THE INVENTION

The present invention relates to a planographic printing plate material capable of forming an image employing laser beams, a printing plate prepared therefrom, and a printing method employing the printing plate.

BACKGROUND OF THE INVENTION

In recent years, a computer to plate system (CTP), in which an image data can be directly recorded in a printing plate material, has been widely used accompanied with the digitization of printing data. As a printing plate material usable for CTP, there are a printing plate material comprising an aluminum support such as a conventional PS plate, and a flexible printing plate material comprising a flexible resin film sheet and provided thereon, various functional layers.

Recently, in commercial printing industries, there is a tendency that many kinds of prints are printed in a small amount, and a printing plate material with high quality, which is inexpensive, has been required in the market. As a conventional flexible printing plate material, there are a silver salt diffusion transfer type printing plate material as disclosed in Japanese Patent O.P.I. Publication No. 5-66564, in which a silver salt diffusion transfer type light sensitive layer is provided on a flexible sheet, an ablation type printing plate material as disclosed in Japanese Patent O.P.I. Publication Nos. 8-507727, 6-186750, 6-199064, 7-314934, 10-58636 and 10-244773 in which a hydrophilic layer and a lipophilic layer, one of which is an outermost layer, are provided on a flexible sheet where the outermost layer is ablated by laser exposure to prepare a printing plate, and a heat melt type printing plate material as disclosed in Japanese Patent O.P.I. Publication No. 2001-96710 in which a hydrophilic layer and a heat melt image formation layer are provided on a flexible sheet where a hydrophilic layer or a heat melt image formation layer is imagewise heated by laser exposure to heat fix the image formation layer onto the hydrophilic layer.

The silver salt diffusion transfer type printing plate material requires a wet development step and a drying step after exposure, which does not give sufficient dimensional accuracy during the image formation step. The ablation type printing plate material does not require a wet development step, but image formation due to ablation is likely to fluctuate in dot shape. Further, there is problem in which the interior of the exposing apparatus or the printing plate surface is contaminated by scattered matters caused by ablation of the layer. The heat melt type printing plate material in which the heat melt image formation layer is fixed onto the hydrophilic layer, after image formation, is mounted on an off-set press. When on printing, a dampening water is supplied to the printing plate material, only the image formation layer at non-image portions is swollen or dissolved by the dampening water, and transferred to a printing paper (paper waste) to remove. Accordingly, a special development step is not required, and image formation due to heat melt provides a sharp dot shape, and prints with high image quality.

When laser exposure is carried out, a flexible printing plate material is generally fixed on a specific position of a flat or curved fixing member of an exposure device, and exposed. As methods of fixing a printing plate material on a fixing member, there are a vacuum fixing method in which a printing plate material is fixed on a fixing member with suction holes under atmospheric pressure, by evacuating air between the plate and the fixing member through the suction holes, a magnetically fixing method in which a printing plate material is fixed on a fixing member with a ferromagnetic surface by magnetic force, and a clamping method in which a printing plate material fixed on a fixing member by mechanically clamping the both edges thereof by clamps.

A printing plate material and a printing plate prepared therefrom according to a silver salt diffusion transfer method are well known, the printing plate material comprising a hydrophilic layer, a silver halide emulsion layer, a physical developing nucleus-containing layer, and a backing layer.

Recently, as color printing spreads, a printing plate material suitable for color printing has been required. Since plural printing plates are employed in the color printing, a printing plate with so-called high register accuracy has been required which does not cause "out of color registration" during printing.

As supports of the planographic printing plate material above for CTP, various ones are known. A printing plate material employing as the support a plastic sheet has been developed in that it is easy to handle and carry (see for example, Japanese Patent O.P.I. Publication Nos. 4-261539 and 5-257287).

However, a silver halide diffusion transfer planographic printing plate material employing as a support a plastic sheet has problems in that printing durability after long term storage and initial ink receptivity are poor, and "out of color registration" during printing, so called "out of register", is likely to be caused. A planographic printing plate material solving these problems has been eagerly desired.

SUMMARY OF THE INVENTION

The present invention has been made to solve the above problems. Accordingly, an object of the invention is to provide a planographic printing plate material which is improved in printing durability after long term storage, initial ink receptivity, and registering property during printing, to provide a printing plate prepared therefrom, and to provide a printing method employing the printing plate.

DETAILED DESCRIPTION OF THE INVENTION

The above object has been attained by one of the following constitutions:

1. A planographic printing plate material comprising a plastic sheet support, and provided thereon, a hydrophilic layer, a silver halide emulsion layer, a physical developing nucleus-containing layer, and a backing layer, wherein the hydrophilic layer, the silver halide emulsion layer and the physical developing nucleus-containing layer are provided on one side of the support, and the backing layer is provided on the other side of the sheet opposite the silver halide emulsion layer, and wherein a surface on the backing layer side has a specific resistance of from $1 \times 10^{11}$ to $1 \times 10^{13}$ $\Omega$, and a coefficient of dynamic friction of from 0.15 to 0.6, the coefficient of dynamic friction being one of the surface on the backing layer side to a stainless steel surface.

2. The planographic printing plate material of item 1 above, wherein the support has an average thickness of from 110 to 300 μm.

3. The planographic printing plate material of item 1 above, wherein at least one of the layers contains gelatin.

4. The planographic printing plate material of item 1 above, wherein the hydrophilic layer contains gelatin.

5. The planographic printing plate material of item 1 above, wherein the backing layer contains gelatin.

6. The planographic printing plate material of item 1 above, wherein the silver halide emulsion layer contains a silver halide emulsion.

7. The planographic printing plate material of item 1 above, wherein the physical developing nucleus-containing layer contains a physical developing nucleus comprised of colloid particles of metals of silver, antimony, bismuth, cadmium, cobalt, lead, nickel, palladium, rhodium, gold, or platinum; particles of sulfides, polysulfides or selenides of these metals; a mixture thereof; or mixed crystals thereof.

8. The planographic printing plate material of item 1 above, wherein the planographic printing plate material is wound around a core with a diameter of from 4 to 10 cm to be in the form of roll.

9. A printing plate prepared by imagewise exposing to laser beams the silver halide emulsion layer side of the planographic printing plate material of item 1 above, and developing the exposed planographic printing plate material.

10. A printing method comprising the steps of:
providing through-holes in the printing plate of item 9 above; and
fixing the printing plate on a plate cylinder of a printing press.

1-1. A planographic printing plate material comprising a plastic sheet support, and provided thereon, a hydrophilic layer, a silver halide emulsion layer, a physical developing nucleus-containing layer, and a backing layer, wherein the surface on the backing layer side has a specific resistance of from $1 \times 10^{11}$ to $1 \times 10^{13}$ Ω, and a coefficient of dynamic friction to a stainless steel surface being from 0.15 to 0.6.

1-2. The planographic printing plate material of item 1-1 above, wherein the support has an average thickness of from 110 to 300 μm.

1-3. The planographic printing plate material of item 1-1 or 1-2 above, wherein at least one of the layers contains gelatin.

1-4. The planographic printing plate material of any one of items 1-1 to 1-3 above, wherein the planographic printing plate material is wound around a core with a diameter of from 4 to 10 μm to be in the form of roll.

1-5. A printing plate prepared by imagewise exposing to laser beams the silver halide emulsion layer side of the planographic printing plate material of any one of items 1-1 to 1-4 above, and developing the exposed layer.

1-6. A printing method comprising the steps of providing through-holes in the printing plate of item 1-5 above, and fixing the resulting printing plate on a plate cylinder of a printing press, employing the through-holes as standard positions.

The present invention will be explained in detail below.

The planographic printing plate material of the invention is characterized in that it comprises a plastic sheet support, and provided thereon, a hydrophilic layer, a silver halide emulsion layer, a physical developing nucleus-containing layer, and a backing layer, the hydrophilic layer, the silver halide emulsion layer, and the physical developing nucleus-containing layer being provided on one side of the support, and the backing layer being provided on the other side of the sheet opposite the silver halide emulsion layer, wherein a surface on the backing layer side has a specific resistance of from $1 \times 10^{11}$ to $1 \times 10^{13}$ Ω, and a coefficient of dynamic friction of from 0.15 to 0.6, the coefficient of dynamic friction being one of the surface on the backing layer side to a stainless steel surface.

It has been fount that a printing plate provides excellent initial ink receptivity, excellent printing durability after long term storage, and improved resistance to out of color registration (out of register), which is prepared from a planographic printing plate material comprising a component layer, including a backing layer, in which a surface on the backing layer side (hereinafter also referred to as simply a rear surface) has a specific resistance and a coefficient dynamic friction each being defined above.

In the planographic printing plate material of the invention, the surface (rear surface) on the backing layer side has a specific resistance of from $1 \times 10^{11}$ to $1 \times 10^{13}$ Ω. The specific resistance as defined in the invention is one determined immediately after the planographic printing plate material has been stored at 23° C. and 20% RH for 24 hours. Typically, immediately after the planographic printing plate material has been stored at 23° C. and 20% RH for 24 hours, the specific resistance was determined under the same conditions a s above, employing a specific resistance meter, for example, an insulation resistance meter, Teraohm Meter Model VE-30 produced by Kawaguchi Denki Co., Ltd.

In the invention, the surface on the backing layer side (rear surface) has a coefficient of dynamic friction to a stainless steel surface being from 0.15 to 0.6.

The coefficient of dynamic friction in the invention is one determined according to the following method. That is, the coefficient of dynamic friction of the surface on the backing layer side of the planographic printing plate material to a stainless steel surface is determined according to JIS-K-7125 (1987). The planographic printing plate material is fixed on a pedestal with the backing layer side surface facing outwardly, and a 50 g load having a 1 cm square stainless steel sheet was put on the sample so that the stainless steel sheet was brought into contact with the backing layer side surface, and force was measured which was necessary to horizontally move the pedestal by 10 cm at a speed of 10 mm/minutes. The resulting measurement chart was processed according to JIS-K-7125 to obtain coefficient of dynamic friction.

The coefficient of dynamic friction can be measured, employing for example, DF-PM APPARATUS produced by Kyowa Kaimen Kagaku Co., Ltd. or a desk-top universal tester AGS-100B produced by Shimazu Seisakusho Co., Ltd.

The methods for preparing a planographic printing plate material whose surface on the backing layer side has a specific resistance and a coefficient of dynamic friction each falling within the range as defined in the invention include the following methods 1 through 4, and a combination thereof, but the invention is not specifically limited thereto.

1: An electrically conductive layer is provided between the plastic sheet support and the silver halide emulsion layer, or on the backing layer side.

2: The total dry thickness of layers (including the backing layer) provided on the backing layer side is from 1 to 8 μm.

3: At least one of layers (including the backing layer) provided on the backing layer side contains gelatin, and the gelatin is cross-linked by a cross-linking agent.

4: The surface roughness Ra of the backing layer side surface is 0.1 to 6 μm.

The methods 1 through 4 above will be explained below.

<<1: An Electrically Conductive Layer is Provided Between the Plastic Sheet Support and the Silver Halide Emulsion Layer, or on the Backing Layer Side>>

In the planographic printing plate material of the invention, an electrically conductive layer is provided between the plastic sheet support and the silver halide emulsion layer, or on the backing layer side, whereby an intended coefficient of dynamic friction of the rear surface or an intended of specific resistance of the rear surface cab be obtained.

Examples of the electrically conductive layer in the invention include a layer containing a water-soluble salt (such as a chloride or nitrate), a vapor-deposited metal layer, water-insoluble inorganic salts described in U.S. Pat. No. 3,428,451, electrically conductive metal oxides described later, or electrically conductive compounds such as electrically conductive polymers including ionic polymers described in U.S. Pat. Nos. 2,861,056 and 3,206,312. Of these, a layer containing the electrically conductive metal oxides or the electrically conductive polymers is preferred.

Preferred electrically conductive compounds are electrically conductive metal oxides as shown below.

The electrically conductive compounds in the invention include electrically conductive polymers, metal oxides, and electrically conductive carbon black.

The electrically conductive polymer in the invention is preferably a water-soluble electrically conductive polymer, and it has an antistatic function in combination with hydrophobic polymer particles and a hardening agent.

As the water-soluble electrically conductive polymer, there is a polymer having at least one electrically conductive group selected from a sulfonic acid group, a sulfuric acid ester group, a quaternary ammonium group, and a carboxyl group, wherein the polymer has not more than 5% by weight per one polymer molecule. The water-soluble electrically conductive polymer may have a hydroxyl group, an amino group, an aziridine group, an active methylene group, a sulfinic acid group, an aldehyde group, or a vinyl sulfone group. The water-soluble electrically conductive polymer has a molecular weight of preferably from 3,000 to 100,000, and more preferably from 3,500 to 70,000. Examples of the water-soluble electrically conductive polymer include a polymer as disclosed in for example, items [0033] to [0046] of Japanese Patent O.P.I. Publication No. 7-20596.

The electrically conductive polymer can be synthesized by polymerizing a monomer prepared according to a conventional method or a monomer available on the market. The content of the electrically conductive polymer is preferably from 0.01 to 10 g/m, and more preferably from 0.1 to 5 g/m$^2$. The electrically conductive polymer can form the electrically conductive layer in the invention singly or in combination with other hydrophilic binders or hydrophobic binders. As the hydrophilic binders, gelatin, polyacrylamide, colloidal albumin, cellulose acetate, cellulose nitrate, polyvinyl alcohol, hydrolyzed polyvinyl acetate, or phthalated gelatin is advantageously used. As hydrophilic binders, there are a polymer having a molecular weight of 20,000 to 1000,000, styrene-butyl acrylate-acrylic acid copolymer, butyl acrylate-acrylonitrile-acrylic acid copolymer, and methyl methacrylate-ethyl acrylate-acrylic acid copolymer.

The hydrophobic polymer particles used in the electrically conductive layer are latex particles which are insoluble in water. The hydrophobic polymers are not specifically limited, but include polymers obtained by polymerizing a monomer selected from styrene, styrene derivative, alkyl acrylate, alkyl methacrylate, olefin derivative, halogenated ethylene, vinyl ester, and acrylonitrile. The hydrophilic polymer is preferably a polymer having styrene, alkyl acrylate, alkyl methacrylate in an amount of preferably not less than 30 mol %, and more preferably not less than 50 mol %.

In order to obtain latex of the hydrophobic polymer, an emulsion polymerization method or a dispersion method, in which the polymer is dissolved in a low boiling point solvent, followed by evaporation of the solvent, can be used, but the emulsion polymerization method is preferred in obtaining fine particles with a uniform particle size. The molecular weight of the hydrophobic polymer is preferably not less than 3,000.

Examples of the hydrophobic polymer include a polymer as disclosed in for example, items [0052] to [0057] of Japanese Patent O.P.I. Publication No. 7-20596. The content of the hydrophobic polymer is preferably from 0.01 to 10 g/m$^2$, and more preferably from 0.1 to 5 g/m$^2$.

In the above emulsion polymerization, a surfactant can be used, and in the dispersion method, a dispersant can be used. As the dispersant, a non-ionic surfactant is used, and typically, a polyalkylene oxide is preferably used. The polyalkylene oxide is a compound having a polyalkylene oxide-chain segment of from 3 to 500. The polyalkylene oxide can be synthesized by condensation of polyalkylene oxide with a compound having active hydrogen such as aliphatic alcohol, phenols, fatty acid, aliphatic mercaptan, or organic amines, or by condensation of polyols such as polypropylene glycol or polyoxytetramethylene with aliphatic mercaptan, organic amines, ethylene oxide or propylene oxide.

The polyalkylene oxide may be a polymer consisting of one kind of polyalkylene oxide-chain segments, or a block copolymer in which two or more kinds of polyalkylene-chain segments are combined through another chain segment in the copolymer molecule. A degree of polymerization of the polyalkylene oxide in the block copolymer is preferably from 3 to 100 in total.

Examples of the polyalkylene oxide used in the invention include those disclosed in Japanese Patent Publication No. 2805012.

The hardener used in the electrically conductive layer is preferably a hydroxyl-containing epoxy hardener, and is more preferably a reaction product [CA] of polyglycidol with epihalohydrin. This product is considered to be a mixture in view of its synthetic method, however, it is not important whether or not it is a mixture, since the effect of the invention can be obtained by controlling the number of a hydroxyl group or an epoxy group in the product. The product may be a mixture or a compound. Examples of the product include those disclosed in paragraphs [0062] to [0073] of Japanese Patent O.P.I. Publication No. 7-20596.

Next, a metal oxide as the electrically conductive compound will be explained. Crystalline metal oxide particles are preferred as metal oxide. Metal oxides containing oxygen defects or a small amount of a hetero atom as a donor are preferred, since they generally have high electroconductivity. The latter metal oxides, containing a small amount of a hetero atom as a donor, are especially preferred, since it does not have adverse effects such as fog on the silver halide emulsion layer.

The metal oxides are preferably $ZnO_2$, $TiO_2$, $SnO_2$, $Al_2O_3$, $In_2O_3$, $SiO_2$, $MgO$, $BaO$, $MoO_3$, $V_2O_5$, and composite metal oxides thereof, and more preferably $ZnO_2$, $TiO_2$, and $SnO_2$. As the metal oxides containing a hetero atom, $SnO_2$ doped with Sb or $TiO_2$ doped with Nb or Ta is effective. The doping amount of the hetero atom is preferably from 0.01 to 30 mol %, and more preferably from 0.1 to 10 mol %.

The metal oxide particles used in the invention are electrically conductive, and have a volume resistivity of preferably not more than $1 \times 10^7$ Ωcm, and more preferably not more than $1 \times 10^5$ Ωcm. Examples of the metal oxide include those disclosed in Japanese Patent O.P.I. Publication Nos. 56-143431, 56-120519, and 58-62647.

The metal oxide particles are used in the form dispersed or dissolved in a binder. The binder used is not specifically limited, as long as it can form a film.

The content by volume of the metal oxide in the electrically conductive layer is preferably higher in order to reduce a specific resistance of the electrically conductive layer employing the metal oxides, and the content of the metal oxide in the electrically conductive layer is not less than 5% by weight in obtaining an electrically conductive layer with sufficient strength. Therefore, the content by volume of the metal oxide in the electrically conductive layer is preferably from 5 to 95%.

The added amount of the metal oxide in the electrically conductive layer is preferably from 0.01 to 10 $g/m^2$, and more preferably from 0.01 to 5 $g/m^2$. The added amount above provides an intended anti-static property.

As the electrically conductive carbon black used in the invention, there are acetylene black, which is obtained according to a continuous cracking method which introduces an acetylene gas into a heated reaction furnace to cause cracking and elevate the furnace temperature, whereby cracking automatically proceeds; soot obtained due to incomplete combustion of oil, tar or resins by indirect flame; another electrically conductive carbon black such as high structure furnace black; and a mixture thereof. The particle size of the carbon black is preferably not more than 100 μm, and more preferably from 0.01 to 2 μm. The carbon black of not less than 100 μm contaminates the coated layer, and cannot be sufficiently dispersed, so that a layer, in which the carbon black is uniformly dispersed, is not obtained. This loses commercial value. The electrically conductive carbon black in the invention is black, and also has an anti-halation property.

Of the electrically conductive compounds described above, the electrically conductive compound in the invention is preferably an electrically conductive polymer or a metal oxide.

In the invention, it is preferred that the electrically conductive layer containing the electrically conductive compound is provided between the support and the silver halide emulsion layer, or on the backing layer side. Provision of the electrically conductive layer improves an electrostatic property, and decreases dust deposition, greatly reducing white spot faults during printing.

<<2: The Total Dry Thickness of Layers Provided on the Backing Layer Side Being from 1 to 8 μm>>

In the invention, at least one subbing layer is provided on the surface of the plastic sheet support opposite the silver halide emulsion layer.

The subbing layer in the invention may be a layer having an anti-reflection property, or an electrically conductive layer containing an electrically conductive compound. Further, one or more layers having another function may be provided on the electrically conductive layer. It is preferred in the invention that the electrically conductive layer or at least one protective layer is provided on the subbing layer side, and the total dry thickness of layers provided on the backing layer side is from 1 to 8 μm.

<<3: At Least One of Layers Provided on the Backing Layer Side Contains Gelatin as a Binder, and the Gelatin is Cross-Linked by a Cross-Linking Agent.>>

In the invention, at least one layer provided on the backing layer side preferably contains gelatin as a binder. The gelatin content of the layer is ordinarily from 0.5 to 5 $g/m^2$, and preferably from 1 to 4 $g/m^2$. This gelatin content is necessary to minimize curl of the planographic printing plate material so that transportability of the material in an exposure device or an automatic processor is not jeopardized.

Gelatin used in the planographic printing plate material of the invention is preferably inactive deionized gelatin. A part of the gelatin in the hydrophilic layer can be replaced with one or more kinds of a hydrophilic polymer such as water-soluble gelatin, starch, dextrin, albumin, sodium alginate, hydroxyethylcellulose, gum arabic, polyvinyl alcohol, polyvinyl pyrrolidone, carboxymethylcellulose, polyacrylamide, styrene-maleic anhydride copolymer, or vinyl methyl ether-maleic anhydride copolymer. A vinyl polymer aqueous dispersion (latex) can be added to the gelatin-containing layer.

These binders described above are preferably hardened with a hardener. The hardener is preferably the vinylsulfone compound described above. As the hardener, those ordinarily used as hardeners of a conventional photographic emulsion layer can be used. The hardener is preferably a vinylsulfone compound. The vinylsulfone compound can be used in combination with other hardeners such as organic hardeners, for example, urea-formalin resin, melamine-formalin resin, epoxy compounds, aziridine compounds, active olefins, and isocyanate compounds, and inorganic salts of polyvalent metals, chromium, aluminum and zirconium, which are well-known as hardeners for the photographic emulsion.

The vinyl sulfone compound used in the invention is a compound having a vinyl group bonding to a sulfonyl group or a group capable of forming a vinyl group bonding to a sulfonyl group, and preferably a compound having two or more of a vinyl group bonding to a sulfonyl group or a group capable of forming a vinyl group bonding to a sulfonyl group.

Formula For example, a compound is preferably used which is represented by the following formula [VS-I]:

$$L-(SO_2-X)m \qquad \text{Formula [VS-I]}$$

In formula [VS-I] above, L represents an m-valent linkage group, X represents —CH=CH$_2$ or —CH$_2$CH$_2$Y in which Y represents a group capable of being released as HY by action of a base, for example, a halogen atom, a sulfonyloxy group, or a sulfoxy group (including its salt form, and m represents an integer of from 2 to 10, provided that when m is 2 or more, plural SO$_2$—X's may be the same or different.

Examples of the m-valent linkage group L include an aliphatic hydrocarbon group (such as alkylene, alkylidene, alkylidine or their combination group), an aromatic hydrocarbon group (such as arylene or its combination group), —O—, —N(R')— (R' represents a hydrogen atom or an alkyl group having a carbon atom number of preferably from 1 to 15), —S—, —N<, —CO—, —SO—, —SO$_2$—, —SO$_3$—, and a group including one or more thereof, provided that when the linkage group has two or more of —N(R')—, two of (R')'s may combine with each other to form a ring. The m-valent linkage groups L further include those having as a substituent a hydroxyl group, an alkoxy group, a carbamoyl group, a sulfamoyl group, an alkyl group or an aryl group.

X is preferably —CH=CH$_2$ or —CH$_2$CH$_2$Cl

Examples of the vinyl sulfone compound represented by formula [VS-I] above include compounds VS-1 through VS-64 disclosed in paragraphs [0041] through [0047] of Japanese Patent O.P.I. Publication No. 2000-258866.

Of the vinyl sulfone compounds represented by formula [VS-I] above, the most preferred compounds include the vinyl sulfone compound represented by formula [V] below:

CH$_2$=CHSO$_2$—R$^0$—SO$_2$CH=CH$_2$     Formula [V]

In formula [V], R$^0$ represents a divalent linkage group such as a substituted or unsubstituted alkylene group, provided that the divalent linkage group may be intervened with an amido linkage, an ether linkage or a thioether linkage.

The vinyl sulfone compound represented by formula [V] has a molecular weight of preferably not more than 230.

Examples of the vinyl sulfone compound represented by formula [V] will be listed below.

|   |   | Mw |
|---|---|-----|
| HD-1 | CH$_2$CHSO$_2$CH$_2$SO$_2$CHCH$_2$ | 196 |
| HD-2 | CH$_2$CHSO$_2$CH$_2$CH$_2$SO$_2$CHCH$_2$ | 210 |
| HD-3 | CH$_2$CHSO$_2$CH$_2$CH$_2$CH$_2$SO$_2$CHCH$_2$ | 224 |
| HD-4 | CH$_2$CHSO$_2$CH$_2$OCH$_2$SO$_2$CHCH$_2$ | 226 |

Examples of the vinyl sulfone compound used in the invention include the aromatic compounds disclosed in German Patent No. 1,100,942 or U.S. Pat. No. 3,490,911, the alkyl compounds containing hetero atoms disclosed in Japanese Patent Nos. 44-29622, 47-25373, and 47-24259, sulfonamides or esters disclosed in Japanese Patent No. 47-8736, 1,3,5-tris[β-(vinylsulfonyl)-propyl]-hexahydro-s-triazine disclosed in Japanese Patent No. 49-24435, alkyl compounds disclosed in Japanese Patent No. 50-35807 and Japanese Patent O.P.I. Publication No. 51-44164, and compounds disclosed in Japanese Patent O.P.I. Publication No. 59-18944.

These vinyl sulfone compounds are dissolved in water or an organic solvent, and used in an amount of from 0.005 to 20% by weight, and preferably from 0.02 to 10% by weight based on the weight of binder.

Hardeners can be contained in all layers or in a specific layer constituting the planographic printing plate material. When plural coating solutions are simultaneously coated to form plural layers, a diffusible hardener can be added to only one coating solution. The addition method of the hardener to a coating solution may be carried out during preparation of the coating solution, during in-line coating, or immediately before coating.

<<4: To Obtain a Surface Roughness Ra of the Backing Layer Side Surface (Rear Surface) of 0.1 to 6 μm>>

In the invention, the surface roughness Ra of the backing layer side surface is preferably 0.1 to 6 μm.

In the invention, the surface roughness Ra means the center line average surface roughness (arithmetic average roughness). When a roughness curve is represented by formula Y=f(X) in a roughness curve with a length L in the center line direction which is extracted from a roughness curve obtained by being measured according to a needle contact meter, the direction of the center line of the curve being set as the X-axis and the direction perpendicular to the X-axis as the Y-axis, the surface roughness Ra (μm) is represented by the following equation:

$$Ra = \frac{1}{L}\int_0^L |f(x)|dx$$

Determination of the length L and measurement of the average roughness are carried out according to JIS-B-0601.

In the invention, after samples are stored at 25° C. and 65% RH for 24 hours so that the samples do not overlap with each other, the surface roughness Ra is measured at 25° C. and 65% RH. Herein, as a method in which the samples are not overlapped with each other, there is one in which the sample with protrusions at the edge portion is wound around a roll, one in which an inter leaf is inserted leaf by leaf between any adjacent two of the samples superposed, or one in which the sample sheet is put sheet by sheet on frames composed of a carton board. Examples of the surface roughness meter used in the invention include a non-contact type three dimension microscopic surface configuration measuring system RSTPLUS produced by WYKO Co., Ltd.

In order to obtain Ra falling within the range of from 0.1 to 6 μm, the following method can be used singly or in combination.

(a) At least one layer on the backing layer side contains gelatin in an amount of from 0.5 to 5 g/m², the gelatin being hardened with a hardener.

(b) An arbitrary component layer on the backing layer side contains an inorganic or organic matting agent with an average particle size of from 0.5 to 10 μm.

(C) A coating solution for a component layer on the backing layer side is coated on a support, constant rate dried, and then dried at not more than 40° C. for 20 seconds. The resulting material is wound around a take-up spool to be in roll form.

As the gelatin and the hardener used in item (a) above, the exemplified compounds as described above can be used.

The inorganic or organic matting agent contained in the arbitrary component-layer on the backing layer side in item (b) above has an average particle size of preferably from 1.0 to 10 μm. It is especially preferred that the inorganic or organic matting agent is contained in an outermost layer on the backing layer side.

Examples of the inorganic matting agent include silicon dioxide, titanium dioxide, magnesium dioxide, aluminum oxide, barium sulfate, calcium carbonate, silver chloride or bromide desensitized according to the known method, glass, and diatomaceous earth. These may be used as a mixture of two or more thereof or in combination with the organic matting agent described later. These matting agents can be obtained according to the method disclosed in U.S. Pat. Nos. 1,260,772, 2,192,241, 3,257,260, 3,370,951, 3,523,022, and 3,769,020.

The inorganic matting agent has an average particle size of preferably from 0.5 to 10 μm, more preferably from 0.7 to 7 μm, and still more preferably from 1 to 5 μm. In the invention, the average particle size of the inorganic matting agent can be obtained by calculating the diameter of a circle corresponding to the projected area in the electron microscope photograph of the matting agent. The content of the inorganic matting agent in the inorganic matting agent-containing layer is preferably from 0.01 to 1 g/m², and more preferably from 0.05 to 0.5 g/m².

The organic matting agent used in the invention is preferably an organic polymer matting agent consisting of an organic polymer. Examples of the organic polymer include acryl resin, vinyl chloride resin, vinyl acetate resin, styrene resin, vinylidene chloride resin, acetal resin, and cellulose. These resins are preferably used in the form dispersed as particles with an average particle size of 0.5 to 20 μm, and preferably 1 to 10 μm in water or in a water-soluble polymer such as gelatin or polyacrylamide.

Examples of the organic matting agent will be listed below, but the invention is not limited thereto.

(1) Acryl resin: polymethyl methacrylate, polyethyl methacrylate, polypropyl methacrylate, polydimethylaminoethyl methacrylate, polymethyl acrylate, polyethyl acrylate, polymethoxyethyl acrylate, etc.

(2): Acryl copolymer resin: copolymers of the monomers described in item (1) above with vinyl chloride, vinylidene chloride, vinylpyridine, styrene, acrylonitrile, acrylic acid, or methacrylic acid, etc.

(3) Vinyl chloride resin: polyvinyl chloride, copolymer of vinyl chloride with vinyl acetate, vinylidene chloride, acrylic acid, methacrylic acid, maleic acid, maleic ester, or acrylonitrile, etc.

(4) Polyvinyl acetate or its partially saponified resin (5) Styrene resin: Polystyrene, copolymer of styrene with acrylonitrile, etc.

(6) Vinylidene chloride resin: polyvinylidene chloride, copolymer of vinylidene chloride with acrylonitrile, etc.

(7) Acetal resin: polyvinyl formal, polyvinyl butyral, etc.

(8) Cellulose: cellulose acetate, cellulose propionate, cellulose butyrate, cellulose nitrate, etc.

(9) Melamine resin: melamine-formaldehyde resin, benzoguanamie-melamine-formaldehyde resin, etc.

A dispersion of these organic matting agents can be obtained according to a method in which the polymers are dissolved in an organic solvent and mixed in water or an aqueous gelatin solution with vigorous stirring, a method in which the polymer is precipitated in form of particles during emulsion polymerization, precipitation polymerization, or pearl polymerization of monomers, or a method in which the matting agent particles are dispersed in water or an aqueous gelatin solution employing a stirrer, a homogenizer, a colloid mill, a flow jet mixer or an ultrasonic dispersion device.

The organic matting agent has an average particle size of preferably from 0.5 to 10 μm, more preferably from 0.7 to 7 μm, and still more preferably from 1 to 5 μm. In the invention, the average particle size of the organic matting agent can be obtained by calculating the diameter of a circle corresponding to the projected area in the electron microscope photograph of the matting agent. The content of the organic matting agent in the inorganic matting agent-containing layer is preferably from 0.01 to 1 g/m$^2$, and more preferably from 0.05 to 0.5 g/m$^2$.

As item (C) above, it is preferred that a coating solution for a component layer on the backing layer side is coated on a support, constant rate dried, and then dried at not more than 40° C. for not less than 20 seconds, and the resulting material is wound around a take-up spool to be in roll form.

A planographic printing plate material comprising a silver halide emulsion layer is generally prepared according to a process in which each component layer solution is coated on a plastic sheet support employing a dip coating method, a air-knife coating method, a curtain coating method, or an extrusion coating method (these coating methods are detailed in Hara Yuji, Coating Technology, Showa 46, published by Asakura Shoten), cooling-set employing cold air, transported in a constant rate drying zone, a decreasing rate drying zone, and a conditioning zone, employing a hanging type transporting method, an arch type transporting method, a meander type transporting method, or an air-supported transporting method.

The constant rate drying zone in the invention is a drying process in which an evaporation amount of solvents per unit time, i.e., the evaporation rate of the solvents, is constant. The decreasing rate drying zone in the invention is a drying process after the constant rate drying zone which is from a zone in which the evaporation rate of solvent is gradually reduced so that the diffusion rate of the solvent in the coated layer is rate-determining to reduce the evaporation rate of solvent to a zone in which the coated layer has an equilibrium moisture content under ambient temperature and humidity. The cooling set is carried out employing cold air of from 5 to 15° C. The constant rate drying is carried out supplying air with a dry-bulb temperature of 20 to 50° C. and a relative humidity of 10 to 35% according to the drying state of the coated layer. In the invention, it is preferred that the coated layer is constant rate-dried, decreasing rate-dried zone, and dried at not more than 40° C. for not less than 20 seconds, and the resulting material is wounded around a take-up spool to be in roll form.

The planographic printing plate material in roll form is cut into an intended size, and packed in a packaging material described later.

The constitution element other than the described above of the planographic printing plate material of the invention will be explained below.

The plastic sheet support will be explained below.

In the invention, the plastic sheet support (hereinafter also referred to as simply the support) is a plastic sheet. Examples of the plastic include polyethylene terephthalate, polyethylene naphthalate, polyimide, polyamide, polycarbonate, polysulfone, polyphenylene oxide, and cellulose ester.

The support in the invention has a coefficient of elasticity at 120° C. (E120) of preferably from 0.98 to 5.88 kN/mm$^2$, and more preferably from 1.18 to 4.9 kN/mm$^2$, in view of a handling property. Examples of such a support include a sheet of polyethylene naphthalate (E120=4.02 kN/mm$^2$), polyethylene terephthalate (E120=1.47 kN/mm$^2$), polybutylene naphthalate (E120=1.57 kN/mm$^2$), polycarbonate (E120=1.67 kN/mm$^2$), syndiotactic polystyrene (E120=2.20 kN/mm$^2$), polyetherimide (E120 =2.16 kN/mm$^2$), polyarylate (E120=1.67 kN/mm$^2$), polysulfone (E120=1.76 kN/mm$^2$), and polyethersulfone (E120=1.67 kN/mm$^2$). These plastics may be used singly or as a mixture of two or more thereof. Two or more of these sheets may be laminated. Especially preferred support is a polyethylene naphthalate sheet or a polyethylene terephthalate sheet.

The coefficient of elasticity herein referred to is a slope of the straight line portion in the stress-strain diagram showing the relationship between strain and stress, which is obtained employing a tension test meter according to JIS C2318. This slope is called Young's modulus.

The support in the invention has an average thickness of preferably from 110 to 300 μm, and a thickness dispersion of preferably not more than 10%, in that a handling property is improved when the planographic printing plate material is mounted on a press.

The average thickness of the support in the invention is preferably from 110 to 300 μm, more preferably from 120 to 280 μm, and still more preferably from 150 to 260 μm.

The thickness dispersion of the support in the invention is preferably not more than 10%, more preferably not more than 8%, and still more preferably not more than 6%. The thickness dispersion herein referred to means a value (%)

obtained by dividing the difference between the maximum thickness and the minimum thickness by the average thickness and then multiplying the difference by 100.

The thickness dispersion of the support is determined according to the following: lines are formed at an interval of 10 cm in both the transverse and longitudinal directions on a 60 cm square polyester film sheet to form 36 small squares. The thickness of the 36 small squares is measured, and the average thickness, maximum thickness and minimum thickness are obtained.

In order to obtain an average thickness or thickness dispersion of the support in the invention falling within the range described above, there is a method in which support forming conditions are optimized or the support prepared is treated with a smoothing roller while post heating, however, it is preferred that the support is prepared according to the following procedures.

The support in the invention is prepared by a method comprising the steps of melting a thermoplastic resin at a temperature of from the melting point (Tm) to Tm+50° C., filtering the melted resin through a filter, extruding the filtrate from a T-die, and casting it on a casting drum at a glass transition point (Tg) −50° C. to Tg to form an unstretched sheet. As a method to obtain the support with the thickness variation falling within the above-described range, a static electricity application method is preferably used.

The unstretched sheet is stretched at from Tg to Tg +50° C. by a stretching magnification of from 2 to 4. As another method to obtain the support with the thickness variation falling within the above-described range, a multi-stretching method is preferably used, in which temperature at a later stretching step is higher than that at a preceding stretching step by preferably 1 to 30° C., and more preferably 2 to 15° C.

The stretching magnification at the preceding stretching step is preferably 0.25 to 0.75 times, and more preferably 0.3 to 0.5 times the stretching magnification at the later stretching step. Thereafter, it is preferred that the stretched sheet is maintained at Tg −30° C. to Tg for 5 to 60 seconds, preferably 10 to 40 seconds, and stretched in the lateral direction at Tg to Tg +50° C. by a stretching magnification of 2.5 to 5.

The resulting sheet, while held through a chuck at (Tm −50° C.) to (Tm −5° C.), is heat fixed for 5 to 120 seconds, where the interval of the chucks in the lateral direction is preferably reduced by more than 0 to 10% (heat relaxation). The heat fixed sheet is cooled, subjected to knurling treatment to give a knurl of 10 to 100 μm at the sheet edge, and wounded around a spool. Thus, a multi-axially stretched film sheet is preferably obtained.

In order to increase adhesion between the support and a coating layer, it is preferred that the surface of the support is subjected to adhesion increasing treatment or is coated with a subbing layer. Examples of the adhesion increasing treatment include corona discharge treatment, flame treatment, plasma treatment and UV light irradiation treatment.

The subbing layer is preferably a layer containing gelatin or latex. The electrically conductive layer is preferably provided as one of the subbing layer.

The support in the invention is preferably a plastic sheet, but may be a composite support in which a plate of a metal (for example, iron, stainless steel or aluminum) or a polyethylene-laminated paper sheet is laminated onto the plastic sheet. The composite support may be one in which the lamination is carried out before any layer is coated on the support, one in which the lamination is carried out after any layer has been coated on the support, or one in which the lamination is carried out immediately before mounted on a printing press.

Particles having a size of from 0.01 to 10 μm are preferably incorporated in an amount of from 1 to 1000 ppm into the support, in improving handling property.

Herein, the particles may be organic or inorganic material. Examples of the inorganic material include silica described in Swiss Patent 330158, glass powder described in French Patent 296995, and carbonate salts of alkaline earth metals, cadmium or zinc described in British Patent 1173181. Examples of the organic material include starch described in U.S. Pat. No. 2,322,037, starch derivatives described such as in Belgian Patent 625451 and British Patent 981198, polyvinyl alcohol described in JP-B 44-3643, polystyrene or polymethacrylate described in Swiss Patent 330158, polyacrylonitrile described in U.S. Pat. No. 3,079,257 and polycarbonate described in U.S. Pat. No. 3,022,169. The shape of the particles may be in a regular form or irregular form.

In the invention, the plastic sheet after stretched and heat-fixed is preferably subjected to heat treatment in order to obtain good transportability in a device such as an exposure device. After the sheet has been stretched, heat fixed, cooled, wound around a spool once, and unwound, the sheet is properly heat treated at a separate process as follows.

As the heat treatment methods in the invention, there are a transporting method in which the film sheet is transported while holding the both ends of the sheet with a pin or a clip, a transporting method in which the film sheet is roller transported employing plural transporting rollers, an air transporting method in which the sheet is transported while lifting the sheet by blowing air to the sheet (heated air is blown to one or both sides of the sheet from plural nozzles), a heating method which the sheet is heated by radiation heat from for example, an infrared heater, a heating method in which the sheet is brought into contact with plural heated rollers to heat the sheet, a transporting method in which the sheet hanging down by its own weight is wound around an up-take roller, and a combination thereof. Tension at heat treatment can be adjusted by controlling torque of an up-take roll and/or a feed-out roll and/or by controlling load applied to the dancer roller provided in the process. When the tension is changed during or after the heat treatment, an intended tension can be obtained by controlling load applied to the dancer roller provided in the step before, during and/or after the heat treatment. When the transporting tension is changed while vibrating the sheet, it is useful to reduce the distance the heated rollers.

In order to reduce dimensional change on heat processing, which is carried out later, without inhibiting thermal contraction, it is desirable to lower the transporting tension as much as possible, and lengthen the heat treatment time. The heat treatment temperature is preferably in the range of from Tg +50° C. to Tg +150° C. In this temperature range, the transporting tension is preferably from 5 Pa to 1 MPa, more preferably from 5 Pa to 500 kPa, and most preferably from 5 Pa to 200 kPa, and the heat treatment time is preferably from 30 seconds to 30 minutes, and more preferably from 30 seconds to 15 minutes. The above described temperature range, transporting tension range and heat treatment time range can prevent the support planarity from lowering due to partial thermal contraction difference of the support occurring during heat treatment and prevent scrapes from occurring on the sheet due to friction between the sheet and transporting rollers.

In the invention, it is preferred that the heat treatment is carried out at least once, in order to obtain an intended dimensional variation rate. The heat treatment can be optionally carried out two or more times.

In the invention, the heat-treated plastic sheet is cooled from a temperature of around Tg to room temperature and wound around a spool. During cooling to room temperature from a temperature exceeding Tg, the heat-treated polyester film sheet is preferably cooled at a rate of not less than −5° C./second in order to prevent lowering of flatness of the sheet due to cooling.

In the invention, the heat treatment is preferably carried out after the subbing layer described later has been coated. There is, for example, a method in which the polyester film sheet is inline coated with the subbing layer between the heat fixing step and the cooling step, wound around a spool, and thereafter, the wound sheet is heat fixed or a method in which the heat fixed polyester film sheet, being wound around a spool, is coated with a subbing layer in a separate line to obtain a subbed polyester film sheet, and successively, the subbed film sheet maintained horizontally is heat treated. Further, the same heat treatment as above may be carried out after various functional layers such as a backing layer, a conductive layer, a lubricant layer and a subbing layer have been coated.

It is preferred in the invention that the planographic printing plate material comprises a support and provided thereon, a silver halide emulsion layer, and at least on hydrophilic layer between the support and the silver halide emulsion layer.

The hydrophilic layer in the invention will be explained below.

The hydrophilic layer is defined as a layer, which has low affinity to printing ink and high affinity to water, when the planographic printing plate material of the invention is used for printing.

The hydrophilic layer in the invention preferably contains gelatin as a binder. The gelatin content of the hydrophilic layer is ordinarily from 0.5 to 5 $g/m^2$, and preferably from 1 to 4 $g/m^2$. The gelatin is preferably inactive deionized gelatin. A part of the gelatin in the hydrophilic layer can be replaced with one or more kinds of a hydrophilic polymer such as water-soluble gelatin, starch, dextrin, albumin, sodium alginate, hydroxyethylcellulose, gum arabic, polyvinyl alcohol, polyvinyl pyrrolidone, carboxymethylcellulose, polyacrylamide, styrene-maleic anhydride copolymer, or vinyl methyl ether-maleic anhydride copolymer. A vinyl polymer aqueous dispersion (latex) can be added to the gelatin layer. These binders described above are preferably hardened with a hardener. The hardener is preferably the vinylsulfone compound described above.

In order to prevent halation, the hydrophilic layer in the invention preferably contains pigment such as carbon black or a dye.

In order to improve printability, the hydrophilic layer in the invention preferably contains solid particles (for example, silica particles) with an average size of 1 to 10 μm. The hydrophilic layer can further contain a photographic agent such as a developing agent. A subbing layer may be provided which is disclosed in Japanese Patent O.P.I. Publication Nos. 48-5503, 48-100203, and 49-16507.

The silver halide emulsion layer in the invention contains a silver halide emulsion. The halide composition of the silver halide is not specifically limited and may be silver chloride, silver chlorobromide, silver iodochlorobromide, silver bromide, silver iodobromide and silver iodide. The silver halide in the invention is preferably silver chloride, silver chlorobromide, or silver iodochlorobromide each containing silver chloride in an amount of not less than 50 mol %. The silver halide emulsion used in the invention can be prepared according to the methods described in P. Glafkides, Chimie Physique Photographique (published by Paul Montel Corp., 19679; G. F. Duffin, Photographic Emulsion Chemistry (published by Focal Press, 1966); V. L. Zelikman et al., Making and Coating of Photographic Emulsion (published by Focal Press, 1964). Any one of acidic precipitation, neutral precipitation and ammoniacal precipitation is applicable and the reaction mode of a water-soluble silver salt and a water-soluble halide can be carried out by single jet addition, double jet addition or a combination thereof.

In order to improve intensity reciprocal law failure or to adjust contrast, the silver halide grains used in the invention preferably contains complex ions or ions of metals belonging to from the 6th group to 10th group in the Periodical Table, and such metals are preferably W, Fe, Co, Ni, Cu, Ru, Rh, Pd, Re, Os, Ir, Pt, and Au.

These metals may be incorporated into silver halide grains in the form of metal complex ions. In the invention, transition metal complexes are preferably six-coordinate metal complexes or complex ions represented by the general formula described below are preferred.

$$(ML_6)^m \qquad \text{General formula}$$

wherein M represents a transition metal selected from elements belonging to from the 6th group to 10th group in the Periodical Table; L represents a ligand; and m represents 0, −1, −2, −3, or −4. Specific examples represented by L include halogens (fluorine, chlorine, bromine, and iodine), cyan, cyanato, thiocyanato, selenocyanato, tellurocyanato, a ligand such as azido or aquo, nitrosyl, thionitrosyl, etc., of which aquo, nitrosyl and thionitrosyl are preferred. When the aquo ligand is present, one or two ligands are preferably coordinated. L may be the same or different.

The particularly preferred specific example of M is rhodium (Rh), ruthenium (Ru), rhenium (Re), iridium (Ir) or osmium (Os).

Specific examples of transition metal ligand complexes are described below.

1: $[RhCl_6]^{3-}$
2: $[RuCl_6]^{3-}$
3: $[ReCl_6]^{3-}$
4: $[RuBr_6]^{3-}$
5: $[OsCl_6]^{3-}$
6: $[IrCl_6]^{4-}$
7: $[Ru(NO)Cl_5]^{2-}$
8: $[RuBr_4(H_2O)]^{2-}$
9: $[Ru(NO)(H_2O)Cl_4]^-$
10: $[RhCl_5(H_2O)]^{2-}$
11: $[Re(NO)Cl_5]^{2-}$
12: $[Re(NO)CN_5]^{2-}$
13: $[Re(NO)Cl(CN)_4]^{2-}$
14: $[Rh(NO)_2Cl_4]^-$
15: $[Rh(NO)(H_2O)Cl_4]^-$
16: $[Ru(NO)(CN)_5]^{2-}$
17: $[Fe(CN)_6]^{3-}$
18: $[Rh(NS)Cl_5]^{2-}$
19: $[Os(NO)Cl_5]^{2-}$
20: $[Cr(NO)Cl_5]^{2-}$
21: $[Re(NO)Cl_5]^{2-}$
22: $[Os(NS)Cl_4(TeCN)]^{2-}$
23: $[Ru(NS)Cl_5]^{2-}$
24: $[Re(NS)Cl_4(SeCN)]^{2-}$

25: $[Os(NS)Cl(SCN)_4]^{2-}$
26: $[Ir(NO)Cl_5]^{2-}$
27: $[Ir(NS)Cl_5]^{2-}$

The metals in these metal ions or metal complex ions may be used singly or as a mixture of two or more kinds thereof. The content of these metal ions or metal complex ions is suitably between $1\times10^{-9}$ and $1\times10^{-2}$ mole per mole of silver halide, and is preferably between $1\times10^{-8}$ and $1\times10^{-4}$ mole per mole of silver halide. Compounds, which provide these metal ions or complex ions, are preferably incorporated into silver halide grains through addition during the silver halide grain formation. These may be added during any preparation stage of the silver halide grains, that is, before or after nuclei formation, growth, physical ripening, and chemical ripening. However, these are preferably added at the stage of nuclei formation, growth, and physical ripening; furthermore, are preferably added at the stage of nuclei formation and growth; and are most preferably added at the stage of nuclei formation. These compounds may be added several times by dividing the added amount. Uniform content in the interior of a silver halide grain can be carried out. As described in Japanese Patent Publication Open to Public Inspection No. 63-29603, 2-306236, 3-167545, 4-76534, 6-110146, 5-273683, etc., incorporation can be carried out so as to result preferably in distribution formation in the interior of a grain. These metal compounds can be dissolved in water or a suitable organic solvent (for example, alcohols, ethers, glycols, ketones, esters, amides, etc.) and then added. Furthermore, there are methods in which, for example, an aqueous metal compound powder solution or an aqueous solution in which a metal compound is dissolved along with NaCl and KCl is added to a water-soluble silver salt solution during grain formation or to a water-soluble halide solution; when a silver salt solution and a halide solution are simultaneously added, a metal compound is added as a third solution to form silver halide grains, while simultaneously mixing three solutions; during grain formation, an aqueous solution comprising the necessary amount of a metal compound is placed in a reaction vessel; or during silver halide preparation, dissolution is carried out by the addition of other silver halide grains previously doped with metal ions or complex ions. Specifically, the preferred method is one in which an aqueous metal compound powder solution or an aqueous solution in which a metal compound is dissolved along with NaCl and KCl is added to a water-soluble halide solution. When the addition is carried out onto grain surfaces, an aqueous solution comprising the necessary amount of a metal compound can be placed in a reaction vessel immediately after grain formation, or during physical ripening or at the completion thereof or during chemical ripening. When the addition is carried out onto grain surfaces, an aqueous solution comprising the necessary amount of a metal compound can be placed in a reaction vessel immediately after grain formation, or during physical ripening or at the completion thereof or during chemical ripening.

The silver halide grains can be desalted using the methods known in the art, such as the noodle washing method and flocculation process.

The light sensitive silver halide grains in this invention may be subjected to chemical sensitization. Preferred chemical sensitizations include chemical sensitizations commonly known in the art, such as sulfur sensitization, selenium sensitization, tellurium sensitization, noble metal sensitization using gold compounds or platinum, palladium and iridium compounds, and reduction sensitization. As compounds used for sulfur sensitization, selenium sensitization, or tellurium sensitization, commonly known compounds can be used, for example, as described in JP-A No. 7-128768. Examples of preferred compounds used for noble metal sensitization include chloroauric acid, potassium chloroaurate, potassium auriothiocyanate, gold selenide, gold selenide and compounds described in U.S. Pat. No. 2,448,060 and British Patent No. 618,061. Examples of compounds used for reduction sensitization include stannous chloride, aminoiminomethanesulfinic acid, hydrazine derivatives, borane compounds, silane compounds and polyamini compounds as well as ascorbic acid and thiourea dioxide. The reduction sensitization can be conducted ripening the emulsion at a pH of not less than 7 or at a pAg of not more than 8.3. Further, reduction sensitization can be achieved by single introduction of silver ions during the grain formation.

The silver halide grains are preferably subjected to spectral sensitization by a spectral sensitizing dye to have sensitivity in intended wavelength regions. Particularly when the planographic printing plate material of the invention is applied to CTP, it is exposed to laser which is installed in an exposure device, and therefore, the silver halide grains are preferably subjected to spectral sensitization to be applied to helium-neon laser, argon laser, LED, and semiconductor laser. In the invention, preferred spectral sensitizing dyes for a helium-neon laser, a red LED or a red semiconductor laser include those disclosed in paragraphs [0011] through [0204] of Japanese Patent O.P.I. Publication No. 2000-122297, preferred spectral sensitizing dyes for an infrared semiconductor laser include those disclosed in paragraphs [0014] through [0059] of Japanese Patent O.P.I. Publication No. 6-230577, and preferred spectral sensitizing dyes for a blue semiconductor laser include those disclosed in paragraphs [0012] through [0023] of Japanese Patent O.P.I. Publication No. 2001-350267.

The binder used in the silver halide emulsion layer is mainly gelatin, but a part of the gelatin can be replaced with the hydrophilic polymer described in the hydrophilic layer above. The gelatin content of the silver halide emulsion is from 0.3 to 2 g/m², and preferably from 0.5 to 1.5 g/m². The silver halide emulsion is preferably hardened with a hardener. As the hardener, those ordinarily used for hardeners of a conventional photographic emulsion layer can be used. The hardener is preferably a vinylsulfone compound. The vinylsulfone compound can be used in combination with other hardeners such as organic hardeners, for example, urea-formalin resin, melamine-formalin resin, epoxy compounds, aziridine compounds, active olefins, and isocyanate compounds, and inorganic salts of polyvalent metals, chromium, aluminum and zirconium, which are well-known as hardeners for the photographic emulsion.

It is preferred in manufacturing the planographic printing plate material of the invention that the light sensitive silver halide emulsion layer be hardened. It is preferred that the light sensitive silver halide emulsion layer be sufficiently hardened before printing. The hardener may be added to a photographic emulsion layer coating solution in a similar manner as a conventional photographic emulsion is hardened. The photographic emulsion layer may be hardened, for example by heating, before or after development or processing of the planographic printing plate material. In order to obtain stable hardening, it is preferred that a silver halide emulsion containing a hardener is coated on a support, dried, and then heat-treated at appropriate temperature. The heat-treatment is one for obtaining stable hardening, and may be carried out at 80 to 150° C. for several minutes to several tens minutes, or at 30 to 50° C. for one to twenty days.

Particles with a particle size of from 2 to 10 μm are preferably added to the silver halide emulsion layer in order to prevent its abrasion during printing. As the particles, particles of silica, talc, or rice starch can be used, but silica particles are preferred.

The silica particles are added in an amount of from 0.01 to 1 g/m$^2$ to the silver halide emulsion layer. Excessively high silica particle content results in scumming or in lowering of ink density during printing.

It is preferred that so-called antireflection dyes or pigment are applied in order to improve image sharpness, i.e., resolution or sharpness of final printing images. These dyes or pigment are added to the silver halide emulsion layer on a support, so-called an anti-reflection layer provided between the silver halide emulsion layer and the support, or a layer provided on the side of the support opposite the silver halide emulsion layer.

A physical developing nucleus layer, which is an image receiving layer in the silver salt diffusion transfer process, is provided on silver halide emulsion layer surface farther than the support. Examples of the physical developing nucleus include colloid particles of metals such as silver, antimony, bismuth, cadmium, cobalt, lead, nickel, palladium, rhodium, gold, or platinum, particles of sulfides, polysulfides or selenides of these metals, a mixture thereof and mixed crystals thereof. The physical developing nucleus layer preferably contains a hydrophilic binder in an amount of from 0.5 to 50 mg/m$^2$, Examples of the hydrophilic binder include gelatin, starch, dialdehyde starch, carboxymethyl cellulose, gum arabic, sodium alginate, hydroxyethyl cellulose, polystyrene sulfonic acid, a copolymer of vinyl imidazole and acrylamide disclosed in Japanese Patent O.P.I. Publication No. 53-21602, a copolymer of acrylamide and methyl sulfone having a guanylthiourea unit disclosed in Japanese Patent O.P.I. Publication No. 8-211614. The physical developing nucleus layer may contain a developing agent such as hydroquinone, methylhydroquinone or catechol, or the hardener described above. The pH of a coating solution for the physical developing nucleus layer is in the weak acidic or acidic regions, and typically the pH is ordinarily from 1.6 to 4.0, and preferably from 1.6 to 3.5.

In the invention, as described above, the hydrophilic layer is preferably provided between the support and the silver halide emulsion layer.

Each of the coating solutions for the hydrophilic layer, silver halide emulsion layer, and the physical developing nucleus layer may contain an anionic, cationic or non-ionic surfactant, an anti-foggant, a matting agent, a viscosity increasing agent, or an anti-static agent.

The planographic printing plate material manufactured above was cut into an intended size, wound around a spool to be in roll form, packed in a packaging material and stored till the material is subjected to exposure for image formation as described later. In order to endure a long term storage, the packaging material is preferably one having an oxygen permeability of not more than 50 ml/atm·m$^2$·30° C.·day as disclosed in Japanese Patent O.P.I. Publication No. 2000-206653. As another embodiment, the packaging material is also preferred which has a moisture permeability of not more than 10 g/atm·m$^2$·20° C.·day as disclosed in Japanese Patent O.P.I. Publication No. 2000-206653.

A developer in the invention can contain an alkali such as sodium hydroxide, potassium hydroxide, lithium hydroxide or sodium phosphate; a preserver such as sulfite; a silver halide-solubilizing agent such as thiosulfate, thiocyanate, cyclic imide, 2-mercaptobenzoic acid or amines; a thickner such as hydroxyethylcellulose or carboxymethylcellulose; an Antifoggant such as potassium bromide or a compound disclosed in Japanese Patent O.P.I. Publication No. 47-26201; a developing agent such as hydroquinone, catechol, or 1-phenyl-3-pyrazolidone; or a development modifier such as polyoxyalkylene compounds or onium compounds. The developer can further contain a compound for improving ink receptivity of silver surface as disclosed in U.S. Pat. No. 3,776,728.

In the invention, a printing plate is obtained by imagewise exposing the silver halide emulsion layer side of the planographic printing plate material of the invention to laser beams based on image data, and developing it. In the invention, the exposure is carried out employing laser, and the laser may be one which emits light having a visible to infrared wavelength regions. The laser may be a gas laser or a semiconductor laser. Scanning exposure is preferably carried out employing these lasers.

A device suitable for the scanning exposure in the invention may be any device capable of forming an image with laser on the planographic printing plate material according to image signals from a computer.

An external cylinder process in which the planographic printing plate material provided along the outer peripheral wall of an exposure cylinder having a diameter of 250 mm or more is subjected to scanning exposure in the rotational direction (in the main scanning direction) of the cylinder, employing one or several lasers located outside the cylinder, moving the lasers in the normal direction (in the sub-scanning direction) to the rotational direction of the cylinder or an internal cylinder process in which the planographic printing plate material provided along the inner peripheral wall of a half cylinder for exposure is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

In the invention, a preferred exposure device is an exposure device comprising a laser, an exposure cylinder, and a planographic printing plate material in roll form comprising a plastic sheet and provided thereon, a hydrophilic layer, a silver halide emulsion layer, a physical development nucleus layer and a backing layer, wherein the material is unwound, fed onto the exposure cylinder, fixed to the cylinder surface under reduced pressure, and then imagewise exposed to laser beams according to image data.

Employing the printing plate material after image recording, printing is preferably carried out without a special development process. After the printing plate material is imagewise exposed and mounted on a plate cylinder of a printing press, or after the printing plate material is mounted on the cylinder and then imagewise heated to obtain a printing plate material, a dampening water supply roller and/or an ink supply roller are brought into contact with the surface of the resulting printing plate material while rotating the plate cylinder to remove non-image portions of the component layer of the printing plate material.

In order to make it easier to mount the planographic printing plate material on the plate cylinder and to prevent out of color register due to out of register during printing, it is preferred in the printing process of the invention that the material is punched to form through-holes, and fixed onto the plate cylinder, employing the through-holes as standard positions.

The non-image portion removal after image recording as described above in the planographic printing plate material of the invention can be carried out in the same sequences as in conventional PS plates. This means that processing time is shortened due to so-called development on press, resulting in lowering of cost.

It is preferred that the printing method of the invention comprises a step of drying a printing plate material, between the image recording (formation) step and a step of contacting a dampening water supply roller and/or an ink supply roller with the surface of the printing plate material. In the printing method of the invention, it is considered that the image strength gradually increases immediately after the image recording. As the conventional image recording method employing a conventional external cylinder process (as described above) requires about 3 minute exposure time, it has problem in that there is a difference in image strength between an image recorded at the beginning of the exposure and an image recorded at the completion of the exposure. The drying step described above can minimize such an image strength difference.

When printing is carried out employing ink containing no petroleum volatile organic solvent, so-called the environment friendly ink, the planographic printing plate material of the invention markedly provides advantageous effects of the invention. Examples of the environment friendly ink include soybean oil ink, Naturalith 100 produced by Dainippon Ink Kagaku Kogyo Co., Ltd., VOC zero ink, TK Hyecho SOY1 produced by Toyo Ink Manufacturing Co., Ltd., and process ink, Solsavo produced by Tokyo Ink Co., Ltd.

EXAMPLES

The present invention will be detailed employing the following examples, but the invention is not limited thereto. In the examples, "%" is % by weight and "parts" is parts by weight, unless otherwise particularly specified.

Example 1

<<Preparation of Support 1>>

(Support 1: Polyethylene Terephthalate Sheet)

Employing terephthalic acid and ethylene glycol, polyethylene terephthalate having an intrinsic viscosity VI of 0.66 (at 25° C. in a phenol/tetrachloroethane (6/4 by weight) solvent) was prepared according to a conventional method. The resulting polyethylene terephthalate was formed into pellets, dried at 130° C. for 4 hours, and melted at 300° C. The melted polyethylene terephthalate was extruded from a T-shaped die onto a 50° C. drum, and rapidly cooled. Thus, an unstretched sheet having an average thickness of 190 μm was obtained. The sheet was stretched in the mechanical direction at 102° C. by a stretching magnification of 1.3, and then at 110° C. by a stretching magnification of 2.6. Successively, the stretched sheet was further stretched at 100° C. by a stretching magnification of 4.5 in the transverse direction in a tenter. The resulting sheet was heat fixed at 240° C. for 20 seconds and relaxed at 240° C. in the transverse direction by 4%. Thereafter, the sheet at the chuck portions in the tenter was cut off, and the both edges in the transverse direction of the sheet were subjected to knurling treatment. The knurled sheet was cooled to 40° C., and wound around an up-take spool at a tension of 47 N/m. Thus, support 1 was prepared. The width of the thus obtained polyethylene terephthalate sheet had a width of 2.5 m. The thickness dispersion of the sheet was 3%.

<<Preparation pf Subbed Support>>

The both surfaces of the support prepared above were subjected to corona discharge treatment at 8 W/m²·minute.

Subsequently, the following subbing layer coating solution "a" was coated on one side of the support to give a first subbing layer with a dry thickness of 0.8 μm, and further, the following subbing layer coating solution "b" was coated on the resulting layer to give a second subbing layer with a dry thickness of 0.1 μm, while carrying out corona discharge treatment (at 8 W/m²·minute), each layer being dried at 180° C. for 4 minutes. The surface of the thus obtained subbing layer was designated as subbing layer surface A. The following subbing layer coating solution "c-1", "c-2", or "c-3" as shown in Table 1 described later was coated on the side of the support opposite the first subbing layer to give a third subbing layer with a dry thickness of 0.8 μm, and further, the following subbing layer coating solution "d-1", "d-2", or "d-3" as shown in Table 1 described later was coated on the resulting layer to give a fourth subbing layer with a dry thickness of 1.0 μm, while carrying out corona discharge treatment (at 8 W/m²·minute), each layer being dried at 180° C. for 4 minutes. The surface of the thus obtained subbing layer was designated as subbing layer surface B. The subbing layer surfaces A and B were subjected to plasma treatment under conditions described later. Thus, (subbed) supports A, B and C were prepared.

| (Subbing layer coating solution "a") | |
|---|---|
| Latex of styrene/glycidyl methacrylate/butyl acrylate (60/39/1) copolymer (Tg = 75° C.) | 6.3% (in terms of solid content) |
| Latex of styrene/glycidyl methacrylate/butyl acrylate (20/40/40) copolymer | 1.6% (in terms of solid content) |
| Anionic surfactant S-1 | 0.1% |
| Water | 92.0% |
| (Subbing layer coating solution "b") | |
| Gelatin | 1% |
| Anionic surfactant S-1 | 0.05% |
| Hardener H-1 | 0.02% |
| Matting agent (Silica particles with an average particle size of 3.5 μm) | 0.02% |
| Antifungal agent F-1 | 0.01% |
| Water | 98.9% |

S-1

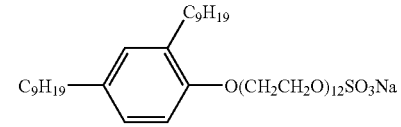

H-1

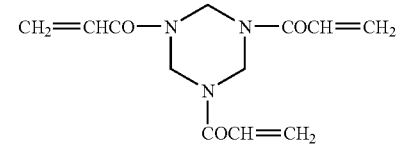

F-1

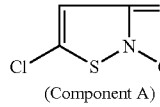

(Component A):(Component B):(Component C) = 50:46:4 (by mole)

| (Subbing layer coating solution "c-1") | |
|---|---|
| Latex of styrene/glycidyl methacrylate/butyl acrylate (20/40/40) copolymer | 0.4% (in terms of solid content) |
| Latex of styrene/glycidyl methacrylate/butyl | 7.6% |

-continued

| | |
|---|---|
| acrylate/acetoacetoxyethyl methacrylate (39/40/20/1) copolymer | (in terms of solid content) |
| Anionic surfactant S-1 | 0.1% |
| Water | 91.9% |
| (Subbing layer coating solution "c-2") | |
| Julimer ET-410 (Tg = 52° C.) (produced by Nippon Junyaku Co., Ltd.) | 21% |
| $SnO_2$/Sb (9/1 by weight) particles (average particle size: 0.25 μm) | 67% |
| Matting agent polymethyl methacrylate (average particle size: 5 μm) | 4% |
| Denacol EX-614B (produced by Nagase Kasei Kogyo Co., Ltd.) | 7% |
| (Subbing layer coating solution "c-3") | |
| Latex of styrene/glycidyl methacrylate/butyl acrylate (60/39/1) copolymer (Tg = 75° C.) | 6.2% (in terms of solid content) |
| Latex of styrene/glycidyl methacrylate/butyl acrylate (20/40/40) copolymer | 1.7% (in terms of of solid content) |
| Anionic surfactant S-1 | 0.1% |
| Water | 92.0% |
| (Subbing layer coating solution "d-1") | |
| Conductive composition of *Component d-11 (*1)/Component d-12 (*2)/Component d-13(*3) (=66/31/1) | 6.4% |
| Hardener H-2 | 0.7% |
| Anionic surfactant S-1 | 0.07% |
| Matting agent (Silica particles with an average particle size of 3.5 μm) | 0.03% |
| Water | 93.4% |

(*1) Component d-11:
Copolymer (Anionic polymer) of styrene sulfonic acid/maleic acid (50/50)
(*2) Component d-12:
Latex of styrene/glycidyl methacrylate/butyl acrylate (20/40/40) copolymer
(*3) Component d-13:
Copolymer (Polymer surfactant) of styrene/sodium isoprene sulfonate (80/20)

H-2
Mixture of three compounds below

[Chemical structures shown]

<Subbing layer coating solution "d-2">

| | |
|---|---|
| PVdC polymer latex (Core-shell type latex containing particles comprised of 90% by weight of core and 10% by weight of shell, the core comprised of a copolymer of vinylidene chloride/methyl acrylate/methyl methacrylate/acrylonitrile/acrylic acid {93/3/3/0.9/0.1 (% by weight)}, and the shell comprised of a copolymer of vinylidene chloride/methyl acrylate/methyl methacrylate/acrylonitrile/acrylic acid {88/3/3/3/3 (% by weight)}, the weight average molecular weight of the copolymer being 38,000) | 3,000 parts by weight |
| 2,4-Dichloro-6-hydroxy-s-triazine | 23 parts by weight |
| Matting agent (polystyrene, average particle size of 2.4 μm) | 1.5 parts by weight |

| (Subbing layer coating solution "d-3") | |
|---|---|
| Gelatin | 1% |
| Anionic surfactant S-1 | 0.05% |
| Antifungal agent F-1 | 0.01% |
| Water | 98.9% |

[Plasma Treatment]

The resulting subbed support was subjected to plasma treatment in the presence of a mixed gas of argon/nitrogen/hydrogen (90/5/5% by volume) at a high frequency output power of 4.5 kW and at a frequency of 5 kHz for 5 seconds, employing a batch type atmospheric pressure plasma treatment apparatus AP-I-H340 (produced by Iishii Kagaku Co., Ltd.).

<<Heat Treatment of Subbed Support>>

(Heat Treatment Conditions)

Each subbed support was slit to obtain a width of 1.25 m, and subjected to heat treatment (low tension heat treatment) at a tension of 2 hPa at 180° C. for one minute.

Preparation of Silver Halide Emulsion A

Employing a double-jet method, silver chlorobromide core grains comprised of 70 mole percent of silver chloride and 30 mole percent of silver bromide, which had an average diameter of 0.09 μm. The core grains were prepared by mixing an aqueous silver nitrate solution and an aqueous water-soluble halide solution in the presence of $7 \times 10^{-8}$ mole of $K_3Rh(NO)_4(H_2O)_2$ and $8 \times 10^{-6}$ mole of $K_3OsCl_6$, each based on 1 mol of silver to be added, while maintaining at a pH of 3.0, at a silver potential (EAg) of +165 mV, and at 40° C. NaCl was added according to a double-jet method so that EAg was reduced to +125 mV to form a shell on the core grain surface. When the shell was formed, the halide solution containing $3 \times 10^{-7}$ mole per mol of silver of $K_2IrCl_6$ and $9 \times 10^{-8}$ mole per mole of silver of $K_3RhCl_6$ was employed. Further, a part of halides of the grain surface was replaced with iodine employing fine silver iodide grains.

The thus obtained emulsion was a core/shell type monodispersed silver chlorobromoiodide (comprised of 70 mole percent of silver chloride, 0.2 mole percent of silver bromoiodide and 29.8 mole percent of silver bromide) emulsion (having a variation coefficient of 10 percent) and the silver chlorobromoiodide grains were cubic crystals having a (100) plane ratio of 87%.

Subsequently, desalting was carried out employing modified gelatin such as exemplified compound G-8 described on page 287 (3) of Japanese Patent O.P.I. Publication No. 2-280139, which is described in JP O.P.I. No. 2-280139. After said desalting, the EAg was 190 mV at 50° C.

The obtained silver halide emulsion A was subjected to chemical sensitization employing chloroauric acid, inorganic sulfur, thiourea dioxide, and 2,3,4,5,6-pentafluorophenylphosphine selenide to give an optimum relationship between sensitivity and fog, and thereafter, to spectral sensitization employing sensitizing dye A.

Sensitizing dye A

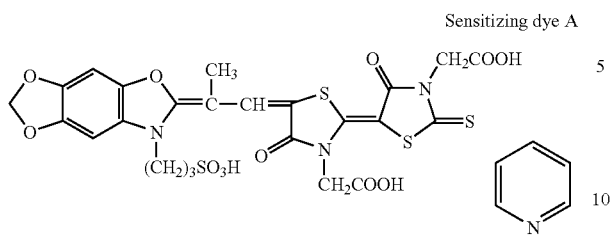

(Preparation of hydrophilic layer coating solution)

| | |
|---|---|
| Gelatin | 20 parts |
| Silica particles with an average particle size of 3.5 μm) | 10 parts |
| Carbon black dispersion solution (Solid content of 32% by weight) | 8 parts |
| Styrene-butadiene latex (POL 752A (produced by Nippon A & L Co., Ltd.) | 2 parts |
| Surfactant Sodium dodecylbenzene sulfonate | 0.2 parts |
| Vinylsulfone (Exemplified compound HD-2) | 2 parts |

Water was added to make a total amount of 400 parts, and pH of the solution was adjusted to 5.0.

The resulting hydrophilic layer coating solution was coated employing a method described later to give a wet thickness of 40 g/m².

(Preparation of silver halide emulsion layer coating solution)

| | |
|---|---|
| Silver halide emulsion A (silver nitrate/gelatin = 2/1 by weight) (in terms of silver nitrate) | 14 parts |
| 1-Phenyl-3-pyrazolidone | 1 part |
| Surfactant Sodium dodecylbenzene sulfonate | 0.2 parts |

Water was added to make a total amount of 120 parts, and pH of the solution was adjusted to 4.5.

The resulting silver halide emulsion coating solution was coated employing a method described later to give a wet thickness of 12 g/m².

(Preparation of physical development nucleus layer coating solution)

| | |
|---|---|
| Palladium sulfide sol described below | 10 parts |
| Hydroquinone | 6 parts |
| 1-Phenyl-3-pyrazolidone | 0.4 parts |
| Copolymer of Acrylamide (97 mole) and vinylimidazole (3 mole) (Average molecular weight of 100,000) | 0.05 parts |
| Surfactant | 0.02 parts |
| Vinyl sulfone (Exemplified compound HD-2) | 2 parts |

Water was added to make a total amount of 100 parts, and pH of the solution was adjusted to 4.5.

The resulting physical development nucleus coating solution was coated employing a method described later to give a wet thickness of 10 g/m².

<Preparation of palladium sulfide sol>

| | |
|---|---|
| Solution A: | |
| Palladium chloride | 5 g |
| 12 mol/liter hydrochloric acid | 40 ml |
| Distilled water | 1000 ml |
| Solution B: | |
| Sodium sulfide | 8.6 g |
| Distilled water | 1000 ml |

The solutions A and B were mixed while stirring, and 30 minute after, the mixture was passed through ion-exchange resin in a column to obtain a palladium sulfide sol.

| | |
|---|---|
| (Backing layer 1) | |
| Polyvinyl butyral | 0.4 g/m² |
| (Backing layer 2) | |
| Titanium white | 0.5 g/m² |
| Silica particles (average particles size: 3.5 μm) | 0.1 g/m² |
| Gelatin | 2 g/m² |
| Vinyl sulfone (Exemplified compound HD-3) | 0.1 g/m² |
| (Backing layer 3) | |
| Titanium white | 0.5 g/m² |
| Silica particles (average particles size: 3.5 μm) | 1 g/m² |
| Gelatin | 8 g/m² |
| Formaldehyde | 0.1 g/m² |

[Preparation of Planographic Printing Plate Material Samples 101 Through 106]

The backing layer as described above obtained above was coated in the coating amount described above as shown in Table 1 on the subbing layer surface B of the subbed support, employing a slide-hopper coating method. Thus, materials 101 through 106 having the backing layer were obtained. Materials 101 through 104 were dried under the following condition A, and materials 105 and 106 were dried under the following condition B.

The drying section was composed of five drying zones, a first drying zone through a fifth drying zone, each of which could control dwell time of the material at each zone, temperature, and humidity. The first drying zone was a cooling zone set at 0° C., and used for setting the coated layer. The second and third drying zones were constant rate drying zones, wherein the material (hereinafter also referred to as web) was dried at a backing layer surface temperature of maximum 14° C.

Condition A:

After the constant rate drying, the temperature of the web was elevated to 50° C. at the fourth drying zone, and to 55° C. at the fifth drying zone. The dwell time after the constant rate drying of the web at the zones (total dwell time at both fourth and fifth zones) was 15 seconds.

Condition B:

After the constant rate drying, the temperature of the web was elevated to 30° C. at the fourth drying zone, and to 40° C. at the fifth drying zone. The dwell time after the constant rate drying of the web at the zones was 25 seconds.

The surface roughness Ra of the backing layer side surface of each material was measured by means of a non-contact type three dimension microscopic surface configuration measuring system RSTPLUS produced by WYKO Co., Ltd. That of material 101 was 0.08 µm, that of material 102 10 µm, that of material 103 1.0 µm, that of material 104 0.08 µm, that of material 105 2.0 µm, and that of material 106 2.0 µm.

The hydrophilic layer coating solution and silver halide emulsion layer coating solution obtained above were simultaneously coated in that order on the subbing layer surface A of each of the materials 101 through 106 obtained above, employing a slide-hopper coating method. The drying section was composed of five drying zones, a first drying zone through a fifth drying zone, each of which could control temperature and humidity. The first drying zone was a cooling zone set at 0° C., and used for setting the coated layer. The second and third drying zones were constant rate drying zones, wherein the web was dried at a silver halide emulsion layer surface temperature of maximum 14° C. After the constant rate drying, the temperature of the web was elevated to 30° C. at the fourth drying zone, and to 50° C. at the fifth drying zone. The dwell time of the web at the fifth zone was 10 seconds.

Subsequently, the physical development nucleus layer coating solution was coated on the silver halide emulsion layer employing a dip/wire bar squeeze method, and dried at a 30° C. hot air. Thus, planographic printing plate material samples 101 through 106 were prepared.

<<Measurement of Characteristic Values of the Sample>>

Characteristic values of the backing layer side surface of the planographic printing plate material sample obtained above were measured according to the following methods.

(Measurement of Coefficient of Dynamic Friction)

Measuring apparatus: DF-PM APPARATUS produced by Kyowa Kaimen Kagaku Co., Ltd.

Measuring Method:

Each planographic printing plate material sample was stored at 23° C. and 55% RH for 24, the coefficient of dynamic friction was determined at 23° C. and 55% RH.

The planographic printing plate material sample was fixed on a pedestal with the backing layer side surface facing outwardly, and a 50 g load having a 1 cm square stainless steel sheet was put on the sample so that the stainless steel sheet was brought into contact with the backing layer side surface, and force was measured which was necessary to move the pedestal by 10 cm at a speed of 10 mm/minutes. The resulting measurement chart was processed according to JIS-K-7125. Thus, the coefficient of dynamic friction of the sample to the stainless steel was determined.

[Measurement of Specific Resistance]

Measuring meter: Teraohm Meter Model VE-30 produced by Kawaguchi Denki Co., Ltd.

Measuring method: Immediately after the sample was stored at 23° C. and 20% RH for 24 hours, the specific resistance of the backing layer side surface was determined under the same conditions as above, employing a specific resistance meter.

[Measurement of Dry Thickness]

The section of the sample was observed employing an electron microscope, and the total thickness of the backing layer side was measured. As a result, that of sample 101 was 0.7 µm, that of sample 102 10 µm, that of sample 103 4.0 µm, that of sample 104 0.7 µm, that of sample 105 4.0 µm, and that of sample 106 4.0 µm.

[Measurement of Surface Roughness Ra]

The surface roughness Ra of the backing layer side surface of each sample was measured at 23° C. and 55% RH by means of a non-contact type three dimension microscopic surface configuration measuring system RSTPLUS produced by WYKO Co., Ltd. As a result, that of sample 101 was 0.04 µm, that of sample 102 8.0 µm, that of sample 103 6.5 µm, that of sample 104 0.04 µm, that of sample 105 2.0 µm, and that of sample 106 2.0 µm.

<<Evaluation of Planographic Printing Plate Material Sample>>

The planographic printing plate material sample obtained above was cut into a size for exposure and imagewise exposed employing image setter Dolev 800V3 (produced by CYTEX Co., Ltd.). The imagewise exposure was carried out employing 650 nm laser beams with a beam spot diameter of 18 µm to form an image with a screen number of 175 LPI at 2540 dpi. Herein, dpi represents the dot numbers per 2.54 cm. The image pattern used for the exposure comprised a solid image and a square dot image with a screen number of 175 LPI and a 50% dot area.

Subsequently, the exposed sample was processed employing an automatic developing machine COLORED PARTICLES-286S (produced by MITSUBISHI SEISHI Co., Ltd. and DAINIPPON SCREEN SEIZO Co., Ltd.), wherein the sample was developed with the following developer A at 38° C. for 15 seconds, neutralized and sensitized with the following neutralization and sensitization solution at 38° C. for 15 seconds, and dried at 45° C. Thus, printing plate samples 101 through 106 were prepared.

| (Developer A) | |
|---|---|
| EDTA.2Na | 1 g |
| Potassium hydroxide | 20 g |
| Anhydrous sodium sulfite | 50 g |
| 2-Mercaptobenzoic acid | 1.5 g |
| 2-Aminoethyl-aminoethanol | 15 g |
| Oleophilic agent 2-Mercapto-5-n-heptyloxidiazole | 0.25 g |
| Hydroxyphenylstearic acid (Trade name: Novaacid P, produced by Nippom Yushi Co., Ltd.) | 1 g |

Water was added to make a 1 liter solution.

| (Neutralization and sensitization solution) | |
|---|---|
| Phosphoric acid | 1.2 g |
| Sodium primary phosphate | 25 g |
| Anhydrous sodium sulfite | 2.5 g |
| Ethylene glycol | 5 g |
| Oleophilic agent: 2-Mercapto-5-n-heptyloxadiazole | 0.1 g |
| Diethanolamine | 5 g |

Water was added to make a 1 liter solution, and pH of the solution was adjusted to 6.0.

[Evaluation of Printing Plate Samples 101 Through 106]

The printing plate samples 101 through 106 obtained above were evaluated as a printing plate according to the following printing method.

(Printing Method)

Printing was carried out employing a printing press LITHRONE 26 produced by KOMORI CORPORATION. After notches for registering were punched in the printing plate sample and engaged with a pin of the printing press, printing was carried out employing the following dampening water, ink (Toyo King Hyecho M Magenta, produced by TOYO INK MANUFACTURING Co.) and coated paper sheets.

| <Dampening solution> | |
|---|---|
| Orthophosphoric acid | 10 g |
| Nickel nitrate | 5 g |
| Sodium nitrite | 5 g |
| Ethylene glycol | 100 g |
| Colloidal silica (20% solution) | 28 g |

Water was added to make a 1 liter solution,

[Initial Ink Receptivity]

Printing was started in the same way as in printing sequence in a conventional PS plate. The number of printing paper sheets printed from when printing started till when ink at non-image portions was completely eliminated was counted. The less the number, the higher the initial ink receptivity is.

(Evaluation of Registering Property)

On the shorter sides of the planographic printing plate material sample, two through-holes for setting an exposure standard position and two notches for setting a standard position for printing were punched. After the through-holes were engaged with a pin of an exposure device, exposure was carried out employing the exposure device so that two cross-shaped line images with a width of 50 μm and a length of 2 cm, one line image being 50 cm distant from the other, were recorded, and processed in the same manner as above, employing the automatic developing machine COLORED PARTICLES-286S to obtain a planographic printing plate sample. Thus, three planographic printing plate samples were obtained, per each of the planographic printing plate material samples. After the notches of each of the three planographic printing plate samples were engaged with a pin of the printing press above and mounted on the three plate cylinders of the printing press, printing was carried out in the same manner as above, except that three kinds of color ink, Toyo King Hyecho M Yellow, M Indigo, and M Magenta were used for each exposed sample. When 50 copies were printed, no "out of color registration" was observed in the fiftieth copy. Thereafter, further 20,000 copies were printed, and then the cross-shaped line images in the 20,000$^{th}$ copy was observed employing a magnifying glass, and the distance between two color lines of three color lines (most distant) farthest from each other was measured. The smaller the distance, the more excellent the registering property is.

(Evaluation of Printing Durability)

<Accelerated Aging Test of Planographic Printing Plate Material Sample>

The resulting sample was cut into a size of 73 cm (width)×32 m (length), and wound around a spool made of cardboard having a diameter of 7.5 cm. Thus, a planographic printing plate material sample in roll form was prepared. The resulting printing plate sample was wrapped in a 150 cm×2 m package made of polyethylene terephthalate sheet containing $Al_2O_3$ (thickness of 12 μm)/nylon sheet (thickness of 15 μm)/casting polypropylene sheet (thickness of 70 μm), and heat-sealed to be shielded from atmospheric air. The wrapped material was stored at 60° C. and 60% RH for seven days as an accelerated aging test condition. The package had an oxygen permeation of 1.7 ml/atm·m²·30° C.·day, and a moisture permeability of 1.8 g/atm·m²·25° C.·day. 1 atm. is 101 kPa.

The resulting sample was imagewise exposed to infrared laser for image formation and processed in the same manner as above to obtain a printing plate sample. Printing was carried out in the same manner as above to obtain 20,000 copies. The number of paper sheets printed from when printing started till when 50% or more of dots of the 3% dot image were eliminated was counted. The more the number, the higher printing durability is. The results are shown in Table 1.

TABLE 1

| Planographic printing plate material sample No. (printing plate sample No.) | Subbed support | | Surface characteristics on the backing layer side | | Evaluation | | | |
|---|---|---|---|---|---|---|---|---|
| | Kinds | Coating solution | Backing layer | Coefficient of dynamic friction (μ) | Surface resistance (Ω) | Initial ink receptivity (number) | Registration (μm) | Printing durability (number) | Remarks |
| 101 | A | c-3/d-3 | 1 | 1.1 | 5 × 10$^{14}$ | not less than 200 | 200 | 1,000 | Comp. |
| 102 | A | c-3/d-3 | 3 | 0.04 | 5 × 10$^{14}$ | not less than 200 | 200 | 1,000 | Comp. |
| 103 | A | c-3/d-3 | 2 | 0.5 | 5 × 10$^{14}$ | not less than 200 | 150 | 2,000 | Comp. |
| 104 | B | c-2/d-2 | 1 | 1.1 | 2 × 10$^{11}$ | not less than 200 | 200 | 1,000 | Comp. |
| 105 | C | c-1/d-1 | 2 | 0.3 | 2 × 10$^{11}$ | 6 | 10 | 20,000 | Inv. |
| 106 | B | c-2/d-2 | 2 | 0.3 | 2 × 10$^{11}$ | 8 | 10 | 20,000 | Inv. |

Comp.: Comparative,
Inv.: Inventive

As is apparent from Table 1, the inventive samples comprising the backing layer side surface having the specific resistance and the coefficient of dynamic friction, each falling within the range defined in the invention, provide excellent initial ink receptivity and excellent printing durability after accelerated aging, as compared with comparative samples. Further, the inventive samples provide excellent registering property when printing is carried out after holes were punched in the samples and engaged with a pin of a printing press to fix the punched samples onto the plate cylinder of a printing press.

[Effect of the Invention]

The present invention can provide a planographic printing plate material providing excellent initial ink receptivity, excellent printing durability in accelerated aging test and greatly improved registering property, a printing plate prepared therefrom, and a printing method employing the printing plate.

What is claimed is:

1. A planographic printing plate material comprising a plastic sheet support, and provided thereon, a hydrophilic layer, a silver halide emulsion layer, a physical developing nucleus-containing layer, and a backing layer, wherein the hydrophilic layer, the silver halide emulsion layer, and the physical developing nucleus-containing layer are provided on one side of the support, and the backing layer is provided on the other side of the sheet opposite the silver halide emulsion layer, and wherein a surface on the backing layer side has a specific resistance of from $1 \times 10^{11}$ to $1 \times 10^{13}$ $\Omega$, and a coefficient of dynamic friction of from 0.15 to 0.6, the coefficient of dynamic friction being one of the surface on the backing layer side to a stainless steel surface, and wherein the planographic printing plate material is wound around a core with a diameter of from 4 to 10 cm to be in the form of roll.

2. The planographic printing plate material of claim 1, wherein the support has an average thickness of from 110 to 300 μm.

3. The planographic printing plate material of claim 1, wherein at least one of the layers contains gelatin.

4. The planographic printing plate material of claim 1, wherein the hydrophilic layer contains gelatin.

5. The planographic printing plate material of claim 1, wherein the backing layer contains gelatin.

6. The planographic printing plate material of claim 1, wherein the silver halide emulsion layer contains a silver halide emulsion.

7. The planographic printing plate material of claim 1, wherein the physical developing nucleus-containing layer contains a physical developing nucleus comprised of colloid particles of metals of silver, antimony, bismuth, cadmium, cobalt, lead, nickel, palladium, rhodium, gold, or platinum; particles of sulfides, polysulfides or selenides of these metals; a mixture thereof; or mixed crystals thereof.

8. A printing plate prepared by imagewise exposing to laser beams the silver halide emulsion layer side of the planographiC printing plate material of claim 1, and developing the exposed planographic printing plate material.

9. A printing method comprising the steps of:

providing through-holes in the printing plate of claim 8; and fixing the printing plate on a plate cylinder of a printing press.

* * * * *